(12) United States Patent
Fish

(10) Patent No.: US 7,602,387 B2
(45) Date of Patent: Oct. 13, 2009

(54) ELECTROLUMINESCENT DISPLAY DEVICES

(75) Inventor: David A. Fish, Haywards Heath (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 484 days.

(21) Appl. No.: 10/551,022

(22) PCT Filed: Mar. 26, 2004

(86) PCT No.: PCT/IB2004/000974

§ 371 (c)(1),
(2), (4) Date: Sep. 29, 2005

(87) PCT Pub. No.: WO2004/088627

PCT Pub. Date: Oct. 14, 2004

(65) Prior Publication Data

US 2006/0250330 A1  Nov. 9, 2006

(30) Foreign Application Priority Data

Apr. 4, 2003  (GB) ................................. 0307789.8

(51) Int. Cl.
G09G 3/20 (2006.01)

(52) U.S. Cl. .................... 345/207; 345/76; 345/81; 345/82; 345/80; 345/84; 345/92; 315/169.1; 315/169.3

(58) Field of Classification Search ............ 345/76–83, 345/207; 315/169.3
See application file for complete search history.

(56) References Cited

U.S. PATENT DOCUMENTS

| 4,760,389 A | * | 7/1988 | Aoki et al. | .................. 345/102 |
| 5,838,308 A | * | 11/1998 | Knapp et al. | ................. 345/173 |
| 6,320,325 B1 | * | 11/2001 | Cok et al. | ................. 315/169.3 |
| 6,441,560 B1 | | 8/2002 | Hunter | |
| 6,489,631 B2 | | 12/2002 | Young et al. | |
| 2001/0035848 A1 | | 11/2001 | Johnson et al. | |
| 2001/0055008 A1 | * | 12/2001 | Young et al. | ................. 345/204 |
| 2004/0017162 A1 | * | 1/2004 | Sato et al. | ................. 315/169.3 |

FOREIGN PATENT DOCUMENTS

| EP | 0717446 A2 | 6/1996 |
| EP | 0717446 A3 | 6/1999 |
| EP | 1096466 A1 | 5/2001 |
| EP | 1194013 A1 | 4/2002 |
| WO | 9953472 A1 | 10/1999 |
| WO | 0120591 A1 | 3/2001 |
| WO | 0169520 A2 | 9/2001 |
| WO | 0169520 A3 | 9/2001 |
| WO | 0226905 A2 | 4/2002 |
| WO | 2004023444 A1 | 3/2004 |

* cited by examiner

*Primary Examiner*—Alexander Eisen
*Assistant Examiner*—Stuart McCommas

(57) ABSTRACT

In an active matrix electroluminescent display device a storage capacitor (24) is provided in each pixel for storing a voltage to be used for addressing a drive transistor (22) which controls the illumination of the electroluminescent display element (20). A discharge photosensitive element (34) is provided for discharging the charge storage capacitor in dependence on the display element's light output. A further photosensitive element (40) is provided so as to cancel photocurrents produced in the discharge photosensitive element (34) as a result of light input to the discharge photosensitive element other than from the pixel's display element (20), the further photosensitive element being shielded (44) from light emitted by the display element while being exposed to light from other directions. Irregularities in the display output due to the effects of the unwanted light inputs to the discharge photosensitive elements are then avoided.

13 Claims, 4 Drawing Sheets

ELECTROLUMINESCENT DISPLAY DEVICES

This invention relates to electroluminescent display devices, particularly active matrix display devices having an array of pixels comprising light-emitting electroluminescent display elements and thin film transistors. More particularly, the invention is concerned with an active matrix electroluminescent display device whose pixels include light sensing elements which are responsive to light emitted by the display elements and used to control energisation of the display elements.

Matrix display devices employing electroluminescent, light-emitting, display elements are well known. The display elements commonly comprise organic thin film electroluminescent elements, (OLEDs), including polymer materials (PLEDs), or else light emitting diodes (LEDs). These materials typically comprise one or more layers of a semiconducting conjugated polymer sandwiched between a pair of electrodes, one of which is transparent and the other of which is of a material suitable for injecting holes or electrons into the polymer layer.

The display elements in such display devices are current driven and a conventional, analogue, drive scheme involves supplying a controllable current to the display element. Typically a current source transistor is provided as part of the pixel configuration, with the gate voltage supplied to the current source transistor determining the current through the electroluminescent (EL) display element. A storage capacitor holds the gate voltage after the addressing phase. An example of such a pixel circuit is described in EP-A-0717446.

Each pixel thus comprises the EL display element and associated driver circuitry. The driver circuitry has an address transistor which is turned on by a row address pulse on a row conductor. When the address transistor is turned on, a data voltage on a column conductor can pass to the remainder of the pixel. In particular, the address transistor supplies the column conductor voltage to the current source, comprising the drive transistor and the storage capacitor connected to the gate of the drive transistor. The column, data, voltage is provided to the gate of the drive transistor and the gate is held at this voltage by the storage capacitor even after the row address pulse has ended. The drive transistor in this circuit is implemented as a p-channel TFT, so that the storage capacitor holds the gate-source voltage fixed. This results in a fixed source-drain current through the transistor, which therefore provides the desired current source operation of the pixel.

In the above basic pixel circuit, differential aging, or degradation, of the LED material can give rise to variations in image quality across a display.

Improved voltage-addressed pixel circuits which can compensate for the aging of the LED material have been proposed. These include a light sensing element which is responsive to the light output of the display element and acts to leak stored charge on the storage capacitor in response to the light output, so as to control the integrated light output of the display element during the drive period which follows the initial addressing of the pixel. Examples of this type of pixel configuration are described in detail in WO 01/20591 and EP 1 096 466. In an example embodiment, a photodiode in the pixel discharges the gate voltage stored on the storage capacitor and the EL display element ceases to emit when the gate voltage on the drive transistor reaches the threshold voltage, at which time the storage capacitor stops discharging. The rate at which charge is leaked from the photodiode is a function of the display element output, so that the photodiode serves as a light-sensitive feedback device.

With this arrangement, the light output from a display element independent of the EL display element efficiency and aging compensation is thereby provided. Moreover, the pixel circuit is also able to compensate for the effects of voltage drops which can occur in the current carrying lines supplying the pixels. Reference is made to the paper "A comparison of pixel circuits for Active Matrix Polymer/Organic LED Displays" by D. A. Fish et al., 32.1, SID 02 Digest, May 2002.

While such a technique has been shown to be very effective in achieving a high quality display which suffers less from non-uniformities over a period of time, by counteracting differing LED aging effects that lead to a reduction in the light output level from a pixel for a given drive current level, it has been found that problems with pixel outputs can still be experienced. These can be in the form of corrupted display outputs or irregularities in pixel output brightnesses. It is an object of the present invention to provide an improved pixel circuit of the above described type.

According to one aspect of the invention, there is provided an active matrix electroluminescent display device comprising an array of display pixels, each pixel comprising:
an electroluminescent display element;
a drive transistor for driving a current through the display element;
a storage capacitor for storing a voltage to be used for addressing the drive transistor;
a discharge photosensitive element for discharging the storage capacitor in dependence on the light output of the display element; and
a further photosensitive element which is shielded from light emitted by the display element while being exposed to light from other directions, and which is connected so as to cancel photocurrents produced in the discharge photosensitive element by light from the other directions.

It has been recognized that the discharge photosensitive element in the known pixel circuit can respond to light input other than that intended from the EL display element, causing unnecessary discharging of the storage capacitor and consequently affecting detrimentally the performance of the pixel circuit in providing the desired compensation for aging effects. In the pixel of the invention, the further photosensitive element is used so as to counteract the effects of such unwanted light input to the discharge photosensitive element by being arranged to sense this unwanted light input and correct for the effects of such on the discharge photosensitive element in discharging the storage capacitor. This unwanted light input may be, for example, light entering the pixel concerned from the display elements of adjacent pixels as a form of optical cross-talk, or light entering the pixel from external sources, notably ambient light.

The invention offers the additional advantage that the operation of the further photosensitive element can be effective as well in counteracting the effects of leakage currents which may occur in the discharge photosensitive element and also contribute to a degradation in the performance of the known pixel circuit.

As in conventional pixel circuits, the drive transistor is connected between a power supply line and the display element.

In a preferred embodiment, the storage capacitor is connected between the power supply line and the gate of the drive transistor, the discharge photosensitive element is connected between the gate of the drive transistor and the power supply line, in parallel with the storage capacitor, and the further photosensitive element is connected between the gate of the drive transistor and a reference potential, for example ground, the discharge photosensitive element and the further photosensitive element thus being connected in series between the power supply line and the reference potential line. In this arrangement, photocurrents generated by unwanted light falling on both photosensitive elements, and also leakage currents in these elements, flow from the power supply line to the reference potential (e.g. ground) line and so do not participate in the discharge of the storage capacitor. Such discharge is then determined solely by the photocurrent produced in the discharge photosensitive element in response to photons received thereby from its associated display element.

In the case of the pixels being arranged in rows with the pixels in a row being selected in an addressing phase by a selection (gating) signal supplied via a respective row address conductor, as in conventional devices, the reference potential for a row of pixels may conveniently by provided by a row address conductor associated with an adjacent pixel row. In conventional drive schemes, the selection address signal for a row of pixels is applied to the associated row address conductor for a relatively short row address period, typically corresponding to the frame period divided by the number of rows of pixels in the array, and for the remainder of the frame period the row address conductor is usually held at low, fixed, potential, typically ground.

The discharge photosensitive elements and further photosensitive element preferably comprise photodiodes. Diode-connected transistors may be utilized instead. It is envisaged that other kinds of photosensitive elements, for example photoresistors, could be used although in terms of pixel circuit performance are likely to be less attractive.

As in conventional devices, each pixel can further include an address transistor connected between an input signal line and an input to the pixel coupled to the gate of the drive transistor. Thus, a conventional voltage addressed current source pixel can be implemented. However, the invention may alternatively be used with current addressed pixels, for example using current mirror pixel circuits.

As regards construction, the display device preferably comprises a substrate on which the active matrix pixel circuitry, comprising the pixel drive transistors, storage capacitors and photosensitive elements and associated addressing lines, is carried, and with an electroluminescent layer of the display elements overlying the active matrix circuitry. The photosensitive elements of a pixel are preferably arranged close together so that they experience similar light inputs, other than directly from the electroluminescent layer at the pixel. In an example embodiment, the display elements comprise a transparent electrode layer between the electroluminescent layer and the active matrix circuitry, and a light shield is arranged in each pixel between the further photosensitive element and the overlying electroluminescent layer to prevent light directly from photosensitive element reaching the further photosensitive element. This form of construction can readily be achieved without complicating fabrication of the device and at minimal cost.

Embodiments of active matrix electroluminescent (EL) display devices in accordance with the invention will now described, by way of example, with reference to the accompanying drawings, in which:—

The same reference numbers are used throughout the Figures to denote the same, or similar, parts. It will be appreciated that the Figures are merely schematic and not driven to scale. In particularly, relative dimensions and proportions of parts may be shown exaggerated or reduced for the sake of clarity.

Figure 1:
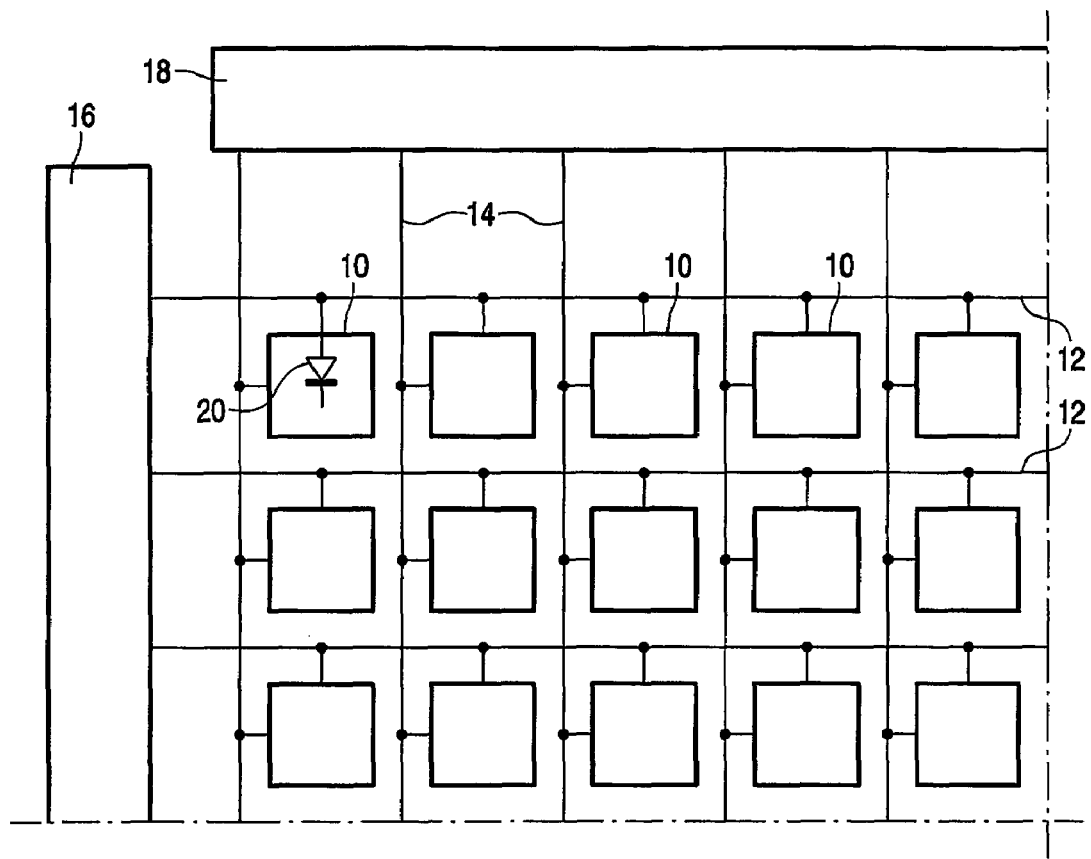
FIG. 1 is a simplified schematic diagram of an embodiment of active matrix EL display device according to the invention.

Referring to FIG. 1, the active matrix EL display device comprises a panel having a row and column matrix array of regularly-spaced pixels, denoted by the blocks 10, each comprising an EL display element 20 and an associated driving circuit controlling the current through the display element, and which are located at the intersections between crossing sets of row (selection) and column (data) address conductors, or lines, 12 and 14. Only a few pixels are shown here for simplicity. The pixels 10 are addressed via the sets of address conductors by a peripheral drive circuit comprising a row, scanning, driver circuit 16 and a column, data, driver circuit 18 connected to the ends of the respective conductor sets.

Each row of pixels is addressed in turn in a frame period by means of a selection pulse signal applied by the circuit 16 to the relevant row conductor 12 so as to program the pixels of the row with respective data signals, determining their individual display outputs in a frame period which follows the address period, according to the respective data signals supplied in parallel by the circuit 18 to the column conductors 14. As each row is addressed, the data signals are supplied by the circuit 18 in appropriate synchronisation.

The EL display element 20 of each pixel comprises an organic light emitting diode, represented here as a diode element (LED), and comprising a pair of electrodes between which one or more active layers of organic electroluminescent light-emitting material are sandwiched. In this particular embodiment the material comprises a polymer LED material, although other organic electroluminescent materials, such as low molecular weight materials, could be used. The display elements of the array are carried, together with their associated active matrix circuitry, on the surface of an insulating substrate. The substrate is of transparent material, for example glass, and either the cathodes or anodes of the display elements 20 are formed of a transparent conductive material, such as ITO, so that light generated by the electroluminescent layer is transmitted through these electrodes. Typical examples of suitable organic conjugated polymer materials which can be used for the EL material are described in WO 96/36959. Typical examples of other, low molecular weight, organic materials are described in EP-A-0717446.

Each pixel 10 comprises a driving circuit including a drive transistor, here in the form of a low temperature polysilicon TFT (thin film transistor), which is responsible for controlling the current through the display element 20 on the basis of a data signal voltage applied to the pixel. A data signal voltage for a pixel is supplied via a column conductor 14 which is shared by a respective column of pixels. The column conductor 14 is coupled to the gate of the current-controlling drive TFT through an address TFT in the pixel driving circuit and the gates for the address TFTs of a row pixels are all connected to a respective, common, row address conductor 12.

Although not shown in FIG. 1, each row of pixels 10 also shares, in conventional manner, a common voltage supply line held at a predetermined potential, and normally provided as a continuous electrode common to all pixels, and a respective common current line. The display element 20 and the drive TFT are connected in series between the voltage supply line and the common current line. The voltage supply line, for example, may be at ground potential and the common current line at a positive potential around, for example, 12V with respect thereto.

Figure 2:
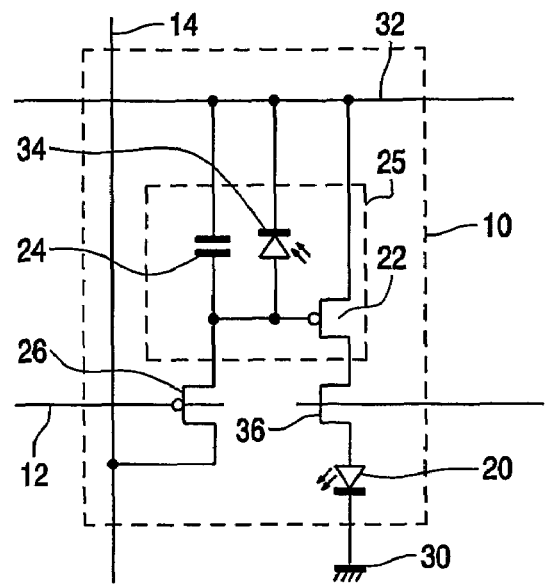
FIG. 2 shows the equivalent circuit of a known form of pixel.

FIG. 2 illustrates a known form of pixel circuit, as described in WO 01/20591 for example. Here the drive TFT and the address TFT are referenced at 22 and 26 respectively, and the voltage supply line and current supply line are referred at 30 and 32 respectively. When the address TFT 26 is turned on in a respective row address period by a selection (gating) pulse signal applied to the row conductor 12, a voltage forming a data signal on the column conductor 14 can pass to the remainder of the pixel. In particular, the TFT 26 supplies the column conductor voltage to a current source circuit 25 which comprises the drive TFT 22 and a storage capacitor 24 connected between the gate of the TFT 22 and the current supply line 32. The column voltage is provided to the gate of the TFT 22 and the gate is held at this voltage, constituting a stored control value, by the storage capacitor 24 even after the address TFT 26 is turned off at the end of the row address period. The drive TFT 22 is here implemented as a P-channel TFT and the capacitor 24 holds the gate—source voltage. This results in a fixed source—drain current through the TFT 22, which therefore provides the desired current source operation of the pixel. Electrical current through the display element 20 is regulated by the drive TFT 22 and is a function of the gate voltage on the TFT 22, which is dependent upon the stored control value determined by the column voltage, data, signal. At the end of the row address period, the address transistor 26 turns off, and the voltage retained by the storage capacitor 24 maintains the operation of the display element during the subsequent drive period before the pixel is addressed again in the next frame period.

The voltage between the gate of the TFT 22 and the common current line 32 thus determines the current passing through the display element 20, and in turn controls the instantaneous light output level of the pixel.

Each row of pixels is addressed in turn in this manner in a respective row address period to load each row of pixels in sequence with their respective data signals and set the pixels to provide desired display outputs for the subsequent drive period, corresponding approximately to a frame period, until they are next addressed.

The pixel circuit further includes photosensitive element, in the form of a discharge photodiode 34, which is reversed biased and responsive to light emitted by the display element 20 and which acts to decay the charge stored on the storage capacitor 24 in dependence on light emitted by the element 20, via the photocurrent generated in the photosensitive element, so as to control the integrated, total, light output of the display element during the remainder of the frame interval following the relevant row address period. The photodiode 34, whose cathode and anode are connected respectively to the line 32 and the gate node of the TFT 22, discharges the gate voltage stored on the capacitor 24 and when the gate voltage on the TFT 22 reaches the TFT's threshold voltage the display element 20 will no longer emit light. The rate at which charge is leaked from the photodiode 34 is a function of the display element light output level so that the photodiode 34 functions as a light sensitive feedback device.

As shown in FIG. 2, an isolating TFT 36 may optionally be connected in series between the drive TFT 22 and the LED element 20 and whose gate is connected to the row address line 12. The TFT 36 is an n-channel device which operates in complementary fashion to the address TFT 26 so as to prevent current flow through the element 20 while the pixel is being programmed in the row address period. At the end of the row address period, and the turning off of TFT 26, the TFT 36 is immediately turned on allowing current to flow through the element 20. This operation of the TFT 36 prevents voltage drops occurring along the line 32 during row addressing.

The photodiode feedback arrangement is here used to compensate for the degradational effects of display element aging, whereby the efficiency of its operation in terms of the light output level produced for a given drive current diminishes. Through such degradation display elements that have been driven longer and harder will exhibit reduced brightness, causing display non-uniformities. The photodiode arrangement counteracts these effects by appropriately controlling the integrated, total, light output from a display element in the drive period. The length of time for which a display element is energized to generate light during the drive period which follows the address period is regulated according to the existing drive current light emission level characteristic of the display element, as well as the level of the applied data signal, such that the effects of degradation are reduced. Degraded, dimmer, display elements will result in the pixel driving circuit energizing the display element for a period longer than that for an un-degraded, brighter, display element so that the average brightness can remain the same over an extended period of time of device operation.

The effectiveness of the operation of this circuit has, however, been found to be diminished by light falling on the photodiode 34 from sources other than the associated display element 20. This unwanted light may be, for example, light emitted by adjacent pixels and reflected internally in the pixel array structure or light emanating from external sources, including ambient light. Moreover, the photodiode 34 inevitably has an inherent leakage current that also tends to degrade the pixel performance.

Figure 3:
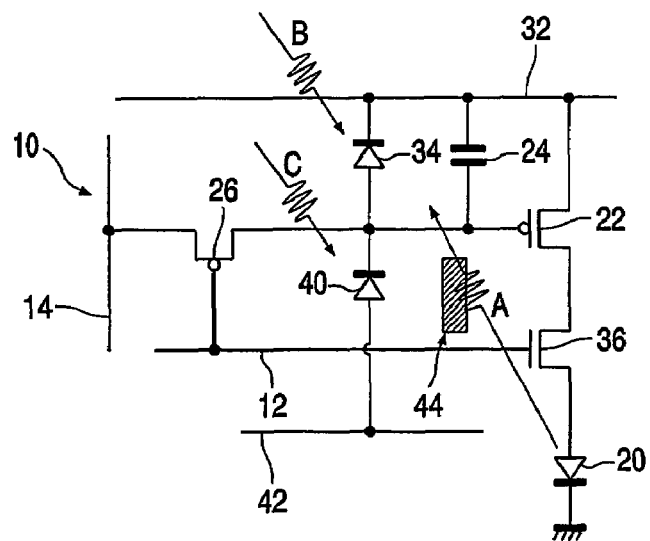
FIG. 3 shows the equivalent circuit of a typical pixel in the device of FIG. 1.

FIG. 3 illustrates the circuit of a typical pixel in the device of FIG. 1. In this circuit a compensating photosensitive element is included to correct for photocurrents produced by unwanted light input. The additional photosensitive element is deliberately shielded from light coming directly from the pixel's display element but otherwise exposed to other potential light sources so as to be affected by unwanted light in the same way as the discharge photosensitive element 34. This further photosensitive element thus provides a measure of the unwanted light input which can be used to counteract or cancel the effects of such on the desired operation of the discharge photosensitive element 34 in decaying charge on the storage capacitor 24. This ensures that the feedback arrangement behaves substantially as intended, that is, in response only to the light input from the display element 20.

Referring to FIG. 3, this further photosensitive element is provided in the form of a second photodiode 40 connected serially with, and with similar polarity to, the discharge photodiode 34 between the line 32 and a reference potential source such that photocurrents due to unwanted light are cancelled. To this end the cathode side of the photodiode 40 is connected to the anode side of the photodiode 34, corresponding to the gate node of the TFT 22, and its cathode side is connected to a line 42 at a predetermined, negative, reference potential with respect to the line 32, and here at ground potential. The photodiode 40 is physically shielded from light emanating directly from the display element 20 by a light shield 44 and is arranged close to the photodiode 34 so that, apart from the light from the element 20, they experience similar light input from other sources. In operation of this circuit arrangement, the photocurrents generated in the photodiodes 34 and 40 due to unwanted light input thereto, and also the leakage circuits in the photodiodes, flow from the power supply line 32 to ground and do not, therefore, participate in the discharge of the storage capacitor 24. Thus, only the photocurrent generated by light from the display element 20 in the pixel falling on the photodiode 34 will serve in operation during the drive period to discharge the storage capacitor 24.

The reference potential line 42 is shared by all pixels in the same row and may in practice conveniently be constituted by a row address conductor 12 associated with an adjacent row of pixels rather than being provided as a dedicated, auxiliary, line. For this purpose, however, the TFTs 26 and 36 are made n and p channel type respectively. It will be appreciated that each row address conductor 12 is held at ground, or a relatively low potential level, for an the entire frame period except for a row address period.

Alternatively, the anode side of photodiode 40 may be connected to the line 30 (common cathode electrode).

Example structures of the device will now be described with reference to FIGS. 4 and 5 which show highly schematically in cross-section an individual pixel in the case of bottom emission device, in which light output from the pixels is obtained through a glass substrate carrying the pixels, and a top emission device, in which light output is in the opposite direction, away from the substrate.

In both cases, the devices comprise a substrate 50 on which the active matrix circuitry and the LED elements are fabricated using known technology, as will be apparent to skilled persons. Here the active matrix circuitry, comprising pixel TFTs, photodiodes, capacitors, address conductors and voltage lines, is denoted generally at 54 and the structure of the LED element 20, comprising a multi-layer structure of known form, is denoted at 55. The LED structure includes a cathode layer 56 extending over the pixel array and common to all pixels. In the bottom emission device, FIG. 4, this comprises light opaque conductive material, and in the top emission device, FIG. 5, comprises optically transparent conductive material. The substrate 50 may be of glass, although in the bottom emission structure other suitable transparent materials, such as a transmissive polymer, might be used, and in the top emission structure a non-transparent material, such as a metal foil covered by an insulating layer, could be used.

The photodiodes 34 and 40 are arranged physically closely adjacent to one another within the area occupied by the pixel, whose boundaries are here indicated by the dotted lines A and B. These photodiodes are formed as amorphous silicon p i n devices, having a structure comprising p, i and n type amorphous silicon sub-layers with the n type layer being uppermost.

Figure 4:
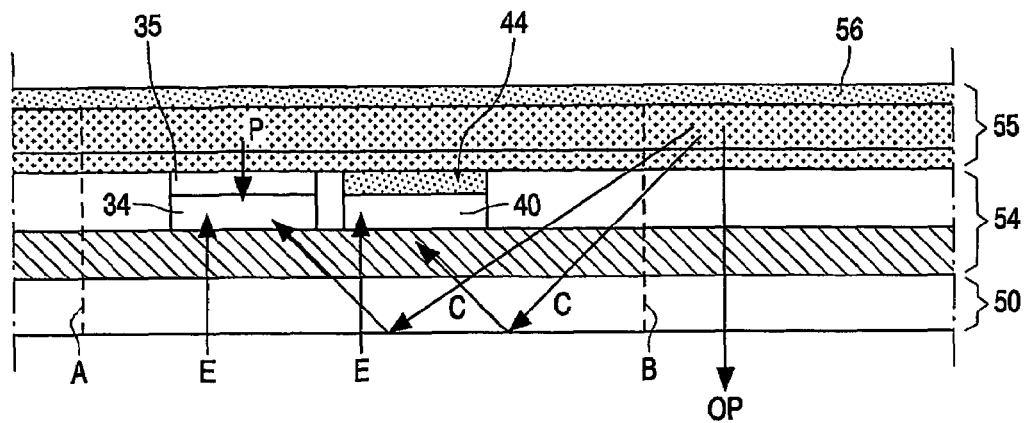
FIG. 4 is a schematic cross-sectional view through a pixel of the device of FIG. 1.
Figure 5:
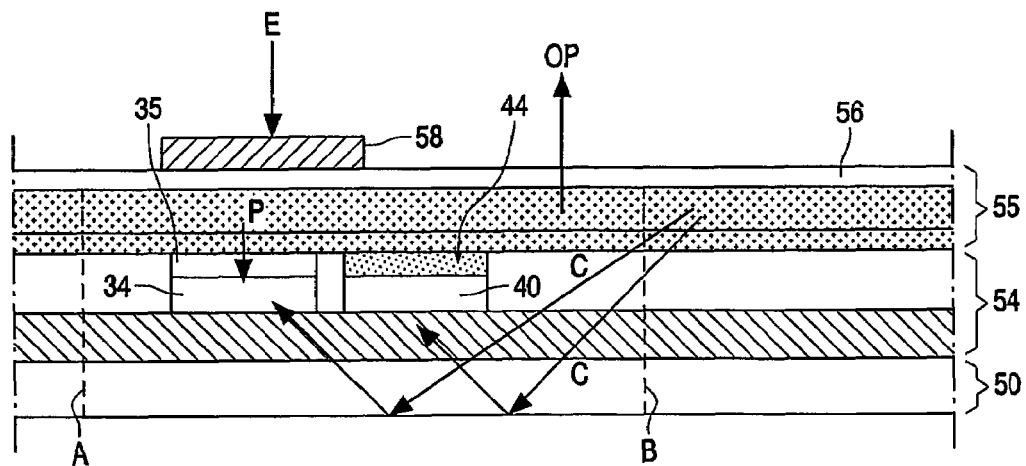
FIG. 5 is a schematic cross-sectional view through a pixel in another embodiment of display device according to the invention.

With regard to the various arrows shown in FIGS. 4 and 5, arrow OP presents the display light output from the LED element which contributes to the display image produced, arrows C represent a possible source of cross-talk light, that is, light from any pixel other than the pixel of interest, arrow E represents external, ambient, light falling on the device, and arrows P represent light from the LED element 20 of the pixel directed deliberately onto the photodiode 34.

In the structure of FIG. 4, the light shield 44 serving to prevent light directly from the LED element 20 falling on the photodiode 40, is provided in the form of a light opaque layer, such as a metal, over the photodiode 40 between the photodiode and the light emission layer of the LED element structure. This metal layer may comprise the top contact of the photodiode 40 or may be additional to the photodiode contact layer. The top contact layer of the photodiode 34, referenced here at 35, comprises a transparent conductive layer, for example of ITO. Thus, the photodiodes 34 and 40 are both subject to cross-talk and external light inputs, denoted by the arrows C and E, but only the photodiode 34 is subject to direct light from the LED element 20. Light from other sources is common to both photodiodes 34 and 40 and the level of such on each photodiode is substantially identical as a result of their comparatively small size and close proximity to one another.

A similar light shielding layer 44 is used in the structure of FIG. 5. In this case, a further light shield, 58, is provided which is arranged on the outer surface of the cathode layer 56 overlying the photodiode 34 to shield it from incoming external light, E, while allowing light directly from the LED element's light emitting layer to fall on the photodiode. This shield 58, which could be extended over the photodiode 40 as well to provide additional shielding for that photodiode, is needed because in this structure the photodiode 40 does not receive light coming in the direction of the arrow E due to the shield 44.

The outer surface of the glass substrate 50 in the FIG. 5 structure may be covered with a light opaque, shielding, layer to prevent any unwanted light entering the structure through the substrate 50. This layer would then perform a similar function to the light opaque cathode layer 56 in the structure of FIG. 4.

A metal layer that is used in the fabrication of the active matrix circuitry to define conductive elements such as address conductors or voltage lines may conveniently be utilized, by appropriate patterning to define additional regions, to form the shielding layer 44 as well, thereby avoiding the need for an additional metal layer deposition process. The external light shield layer 58 may comprise an appropriately patterned metal or other light opaque layer deposited over the cathode layer 56, and may be of similar form to black matrix layers commonly used in active matrix liquid crystal display devices.

The pixel circuit illustrated in FIG. 3 is a preferred example and it is envisaged that the other circuit arrangements for the photodiode 40 may be used.

Moreover, it is also envisaged that photosensitive elements other than photodiodes, may be used, for example photoconductors or photoresistors. Photodiodes are, though, likely to be most effective in the desired operation of the pixel circuit.

Figure 6:
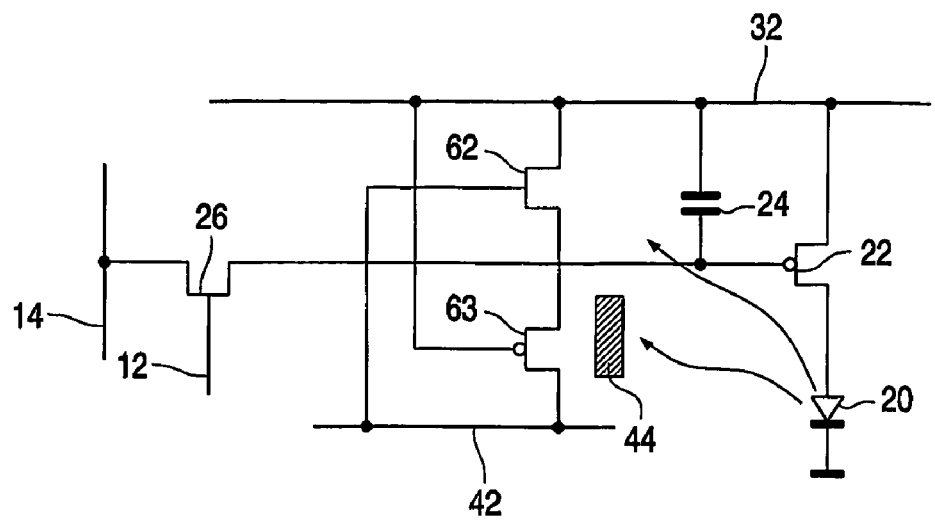
FIGS. 6 and 7 illustrate further examples of pixel circuits in accordance with the present invention.
Figure 7:
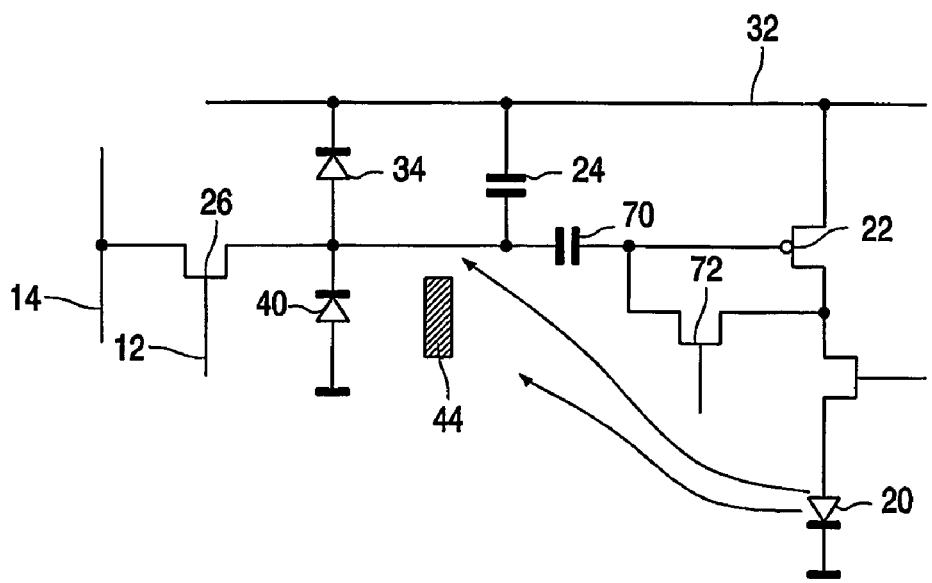

Examples of other pixel circuits which may be used are illustrated in FIGS. 6 and 7.

In the pixel circuit of FIG. 6, diode-connected TFTs 62, 63 are used to replace the photodiodes 34 and 40, the TFTs 62 and 63 being respectively n-channel and p-channel type devices and whose gates are connected to the lines 32 and 42 respectively. The TFTs 62 and 63 are here sized so as to exhibit substantially the same leakage currents and to generate substantially the same photocurrents in response to their common lights inputs.

The pixel circuit of FIG. 7 is similar to that of FIG. 3 except that the circuit further includes an additional capacitor 70 connected between the gate of the TFT 22 and the side of the capacitor 24 connected to the node between the photodiodes 34 and 40, and a further TFT 72 connected between the gate and source electrodes of the TFT 22. In this circuit, automatic compensation for variations in the threshold voltage levels of the TFTs 22 in the array is achieved. The capacitor 24 does not store the desired source—gate voltage of the TFT 22 but instead stores an input drive voltage and the series—connected capacitor 70 provides a voltage shift between the capacitor 24 and the gate of TFT 22 dependent on the threshold voltage level of the TFT 22. The capacitor 70 stores this threshold voltage by means of the TFT 72 which is operable to charge the capacitor 70 to the threshold voltage using a current of the TFT 22. The operation of the pixel circuit in this respect is described more fully in British Patent Application No. 0220614.2 (PHGB 020146) to which reference is invited.

The above pixel circuits are all examples of voltage addressed pixels.

The invention can also be used with known current addressed pixel implementations, for example using current mirrors.

By way of a further example, the pixel circuit of FIG. 3 can be modified to include a further, p type, TFT connected in parallel with the storage capacitor 24 between the line 32 and the gate of TFT 22 and whose gate is connected to the node between the source electrode of the TFT 2 and the anode of the LED element 20. The operation of this further TFT is dependent on the voltage at the node between the TFT 22 and the LED element 20 and such that when the voltage achieves the threshold level of the further TFT, indicative of the drive current/light output level of the LED element reaching a predetermined low level the TFT is switched on to rapidly discharge the storage capacitor 24, thereby abruptly turning off the drive TFT 22 to curtail light output. This enables more precise control of the pixel's light output, as described in WO 01/20591.

In another embodiment of pixel circuit, separate, first and second, storage capacitors may be used to store respectively the gate voltage of the drive TFT and a charge according to the level of an applied data signal, as described in British Patent Application 0305632.2 (PHGB 030025). In this circuit, the first storage capacitor is charged to a predetermined level in the address phase by means of an additional TFT, whereas the second storage capacitor is charged through the addressing TFT. The second storage capacitor is connected to the gate of a discharge TFT connected across the first storage capacitor, and the charge on this second storage capacitor is used to control the operation of the discharge TFT. A feedback photodiode responsive to the light output from the pixel's display element charges or discharges the second storage capacitor according to the amount of light emitted until the voltage at the gate of the discharge TFT reaches its threshold at which point the discharge TFT is turned on to rapidly discharge the first storage capacitor, and therefore turning off the drive TFT connected to the display element. The pixel circuit is modified, according to the present invention, to include a further photosensitive element, for example a photodiode, which is connected across the second storage capacitor and responsive to light inputs other than from the pixel's display element so as to cancel the effects of these other light inputs on the feedback photodiode. In this circuit, therefore, it will be appreciated that the feedback photodiode is not directly connected to the storage capacitor which stores the gate voltage of the drive TFT but, through its effect on charging or discharging the second storage capacitor, and thus the operation of the discharge TFT, serves a similar function in discharging the first storage capacitor according to the pixel's light output.

From reading the present disclosure, other modifications will be apparent to persons skilled in the art. Such modifications may involve other features which are already known in the fields of active matrix electroluminescent display devices and component parts therefor and which may be used instead of or in addition to features already described herein.

The invention claimed is:

1. An active matrix electroluminescent display device comprising an array of pixels, each pixel comprising:
    an electroluminescent display element;
    a drive transistor for driving a current through the display element;
    a storage capacitor for storing a voltage to be used for addressing the drive transistor;
    a discharge photosensitive element for discharging the storage capacitor in dependence on the light output of the display element; and
    a further photosensitive element which is shielded from light emitted by the display element while being exposed to light from other directions, and which is connected so as to cancel photocurrents produced in the discharge photosensitive element by light from the other directions.

2. The display device according to claim 1, wherein the drive transistor is connected between a power supply line and the display element.

3. The display device according to claim 2, wherein the discharge photosensitive element is connected in parallel with the storage capacitor between the power supply line and the gate of the drive transistor, and wherein the further photosensitive element is connected in series with the discharge photosensitive element between the gate of the drive transistor and a reference potential.

4. The display device according to claim 3, wherein the reference potential is provided by a reference potential line shared by other pixels.

5. The display device according to claim 4, wherein the pixels are arranged in rows and columns with each row of pixels having a respective row address conductor via which the row of pixels is selected in a row address phase, and wherein the pixels of a row share a respective reference potential line, and wherein the reference potential line associated with a row of pixels comprises a row address conductor associated with an adjacent row of pixels.

6. The display device according to claim 1, wherein the discharge photosensitive element and the further photosensitive element comprise photodiodes.

7. The display device according to claim 1, wherein the discharge photosensitive element and the further photosensitive element comprise diode-connected transistors.

8. The display device according to claim 1, wherein the pixel further includes an address transistor (26) connected between an input signal line and an input to the pixel coupled to a node between the storage capacitor and the gate of the drive transistor.

9. The display device according to claim 1, wherein the device comprises a substrate, active matrix circuitry comprising the pixel drive transistors, storage capacitors and photosensitive elements overlying the substrate, and wherein the pixel display elements comprise an electroluminescent layer overlying the active matrix circuitry.

10. The display device according to claim 9, wherein the discharge photosensitive element and the further photosensitive element in each pixel are arranged close together.

11. The display device according to claim 9, wherein the pixel display elements include a transparent conductive electrode layer between the electroluminescent layer and the active matrix circuitry, wherein a light shield is arranged in each pixel between the further photosensitive element and the overlying electroluminescent layer to shield the further photosensitive element from light directly from the electroluminescent layer, and wherein the discharge photosensitive element is exposed to light generated in the overlying electroluminescent layer.

12. The display device according to claim 11, wherein the pixel display elements include a light opaque electrode layer at the side of the electroluminescent layer remote from the active matrix circuitry.

13. The display device according to claim 11, wherein the pixel display elements include a second transparent electrode layer at the side of the electroluminescent layer remote from the active matrix circuitry, and wherein a further light shield is arranged on the second transparent electrode layer and overlying the discharge photosensitive element of a pixel.

* * * * *